United States Patent
Sonntag et al.

(10) Patent No.: US 10,423,174 B1
(45) Date of Patent: Sep. 24, 2019

(54) PFM POWER MANAGEMENT SYSTEM WITH AUTONOMOUS MODE SWITCHING

(71) Applicant: Silicon Laboratories Inc., Austin, TX (US)

(72) Inventors: Jeffrey L. Sonntag, Austin, TX (US); Dazhi Wei, Austin, TX (US); Michael D. Mulligan, Austin, TX (US); Zachary A. Kaufman, Austin, TX (US); Joselyn Torres-Torres, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/959,535

(22) Filed: Apr. 23, 2018

(51) Int. Cl.
| | |
|---|---|
| H02M 3/156 | (2006.01) |
| H02M 3/158 | (2006.01) |
| G05F 1/563 | (2006.01) |
| H03K 5/24 | (2006.01) |
| H02M 1/08 | (2006.01) |
| H02M 1/00 | (2006.01) |

(52) U.S. Cl.
CPC ............... G05F 1/563 (2013.01); H02M 1/08 (2013.01); H02M 3/156 (2013.01); H02M 3/158 (2013.01); H02M 3/1582 (2013.01); H03K 5/24 (2013.01); *H02M 2001/0032* (2013.01); *H02M 2001/0045* (2013.01)

(58) Field of Classification Search
CPC ....... H02M 2001/0045; H02M 3/1582; H02M 3/158; H02M 3/156
See application file for complete search history.

(56) References Cited

U.S. PATENT DOCUMENTS

| | | | |
|---|---|---|---|
| 6,617,972 B2 | 9/2003 | Takarada | |
| 7,064,531 B1 | 6/2006 | Zinn | |
| 7,148,670 B2 | 12/2006 | Inn et al. | |
| 8,779,729 B2 | 7/2014 | Shiraishi | |
| 8,823,419 B1 | 9/2014 | O'Leary et al. | |
| 9,557,354 B2 | 1/2017 | Chen et al. | |
| 2012/0203484 A1* | 8/2012 | Ando | G01R 31/3613 702/63 |
| 2012/0229110 A1* | 9/2012 | Huang | H02M 3/1582 323/282 |
| 2014/0191741 A1* | 7/2014 | Nork | G01R 29/24 323/282 |
| 2017/0093271 A1* | 3/2017 | Lai | H02M 1/088 |

OTHER PUBLICATIONS

Maji, S., et al., "Digital LDO with Time-Interleaved Comparators for Fast Response and Low Ripple," 2016 IEEE Computer Society Annual Symposium on VLSI, pp. 337-342.
U.S. Appl. No. 15/902,798, filed Feb. 22, 2018, entitled Low Power Switched-Capacitor Comparator, Inventors Jeffrey L. Sonntag et al.

\* cited by examiner

*Primary Examiner* — Yusef A Ahmed
*Assistant Examiner* — Ishrat F Jamali
(74) *Attorney, Agent, or Firm* — Zagorin Cave LLP (57) ABSTRACT

A pulse frequency modulated (PFM) voltage converter autonomously switches between buck, buck-boost, and boost modes as a function of the input and output voltages. The voltage converter may also switch autonomously between buck mode and a low drop out (LDO) mode when configured in a system in which the battery voltage is known to always be higher than the output voltage.

16 Claims, 5 Drawing Sheets

PFM POWER MANAGEMENT SYSTEM WITH AUTONOMOUS MODE SWITCHING

CROSS-REFERENCE TO RELATED APPLICATION(S)

This application relates to application Ser. No. 15/902,798, filed Feb. 22, 2018, entitled "Low Power Switched-Capacitor Comparator", which application is incorporated by reference herein

BACKGROUND

Field of the Invention

This application relates to voltage converters and more particularly to switching between various modes used by voltage converters.

Description of the Related Art

Voltage converters convert a voltage from a voltage source such as a battery to a voltage used by electronic circuits. For example, a cell phone utilizes a voltage converter to convert the voltage supplied by the battery to a voltage utilized by circuits of the cell phone. The conversion process to convert from one voltage to another utilizes power, and achieving greater efficiency in voltage conversion is desirable to extend battery life.

SUMMARY OF EMBODIMENTS OF THE INVENTION

In an embodiment, a method includes determining a desired mode of operation of a pulse frequency modulation (PFM) voltage converter as a function, at least in part, of a voltage difference between an input voltage to the PFM voltage converter and an output voltage generated by the PFM voltage converter and generating an indication of the desired mode of operation. The method further includes autonomously switching to the desired mode of operation of the PFM converter if a current mode of operation differs from the desired mode of operation.

In another embodiment, a pulse frequency modulation (PFM) voltage converter includes control logic to determine a desired mode of operation of the PFM converter as a function, at least in part, of the input voltage to the PFM voltage converter and the output voltage supplied by the voltage converter. The voltage converter is configured to switch to the desired mode of operation of the PFM converter responsive to a current mode of operation being different from the desired mode of operation.

In another embodiment, a pulse frequency modulation (PFM) voltage converter includes a mode controller to evaluate an output voltage of the PFM voltage converter and an input voltage to the PFM voltage converter to select a mode of operation based on one or more transition threshold voltages at the input voltage and the output voltage. A voltage comparator compares a reference voltage to the output voltage and supplies a voltage comparator output. A selector circuit is coupled to the mode controller and supplies the voltage comparator output to a switched-low drop out (LDO) controller responsive to the mode controller selecting an LDO mode of operation and supplies the voltage comparator output to a buck-boost controller responsive to the mode controller selecting a buck mode, a boost mode, or a buck-boost mode of operation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Voltage converters monitor the output voltage being generated and adjust the operation of the voltage converter to maintain the output voltage at the target voltage level. That requires a comparator to compare the output voltage with the target voltage and supply an indication of the comparison.

Figure 1:
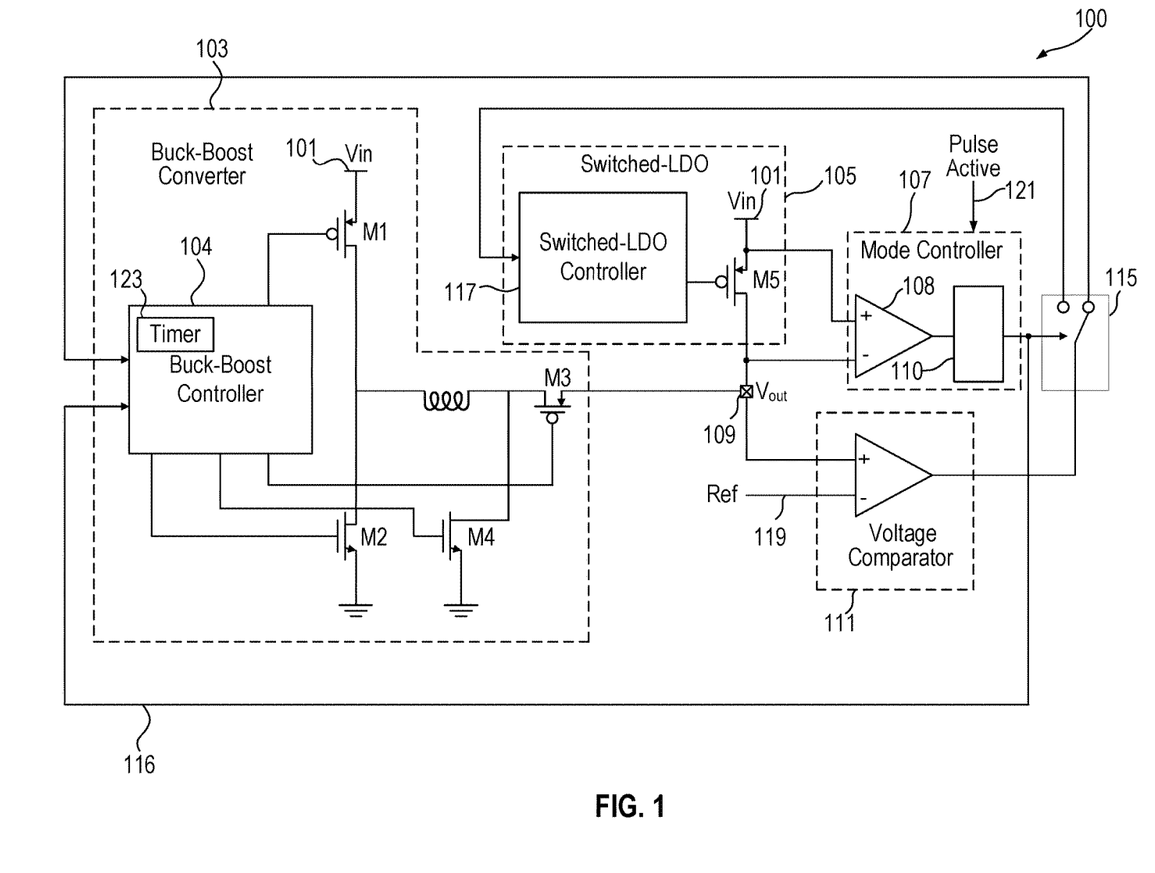
FIG. 1 illustrates a voltage converter according to an embodiment of the invention.

FIG. 1 illustrates an embodiment of a voltage converter 100 that utilizes a battery as a voltage source Vin 101. In an embodiment, voltage converter 100 is a pulse frequency modulated (PFM) voltage converter that includes the buck-boost converter 103 that operates in buck mode, boost mode, or buck-boost mode. A mode controller 107 compares the output voltage 109 and the input voltage 101 and determines the desired operational mode of the voltage converter as described further herein. Each type of power converter (buck, boost, buck-boost, and LDO) has an optimal range of input and output voltages at which the converter works in an efficient and accurate manner. A voltage comparator 111 compares the output voltage Vout 109 to a reference voltage 119 corresponding to the target voltage for the PFM voltage converter and asserts a feedback signal each time the output voltage falls below its target voltage. Embodiments of the voltage comparator are described in application Ser. No. 15/902,798, filed Feb. 22, 2018, entitled "Low Power Switched-Capacitor Comparator", which application is incorporated by reference herein. In an embodiment, when the output voltage is guaranteed to be below the input voltage, the voltage converter operates either in buck mode or a low drop out (LDO) mode using a switched-LDO converter 105. Selector circuit 115 selects the destination for the output of the voltage comparator 111 to be either the buck-boost converter 103 or the LDO converter 105 based on the output of the mode controller 107. Note that the voltage converter 100 uses the same voltage comparator 111 for all modes (buck, buck-boost, boost, LDO). If different comparators were used for different modes, comparator offsets would cause control of the output voltage to be less accurate as the mode autonomously switches.

In boost mode the transistor M1 is on, transistor M2 is off and transistors M3 and M4 switch in accordance with standard boost operation. In buck mode, M3 is on, M4 is off, and M1 and M2 switch in accordance with standard buck operation. In buck-boost mode, the four switches are used in this order: M1 and M4 are on; M1 and M3 are on; then M2 and M3 are on. In switched-LDO operation, only switch M5 is used. Each time the LDO receives a feedback signal from the voltage comparator 111 indicating the output voltage is below the target voltage, LDO controller 117 outputs a single pulse of fixed width and fixed current magnitude. That results in the LDO supplying a known, fixed charge to the output with each pulse, enabling accurate Coulomb counting when in switched-LDO mode.

The mode controller 107 evaluates Vin and Vout responsive to each buck-boost or LDO pulse. For example, the mode controller compares the difference between Vin and Vout to a programmed threshold to determine the best or preferred mode for system operation. Built-in hysteresis may be used to avoid continually switching modes near the threshold. The mode controller only needs to make one comparison for each current pulse, and therefore has a negligible effect on the system efficiency, including at light-load. The mode controller can be substantially powered down between pulses of the buck, buck-boost, boost and LDO converters to save power.

The mode of operation can be dynamically changed as the input and/or output voltages change. In most practical battery-operated systems, the battery voltage changes over time. The buck-boost converter and switched-LDO both work in the same PFM feedback loop with the voltage comparator, thereby allowing seamless transitions between modes. The frequency of the current pulses supplied to the output increases if more charge is needed to maintain the output voltage at the target voltage. The frequency of the current pulses can be decreased if less charge is needed to maintain the output voltage at the target voltage.

Coulomb counting is maintained across modes since both the buck-boost converter 103 and the switched-LDO converter 105 produce a fixed charge per pulse in a PFM system. Coulomb counting can provide an indication of how much charge has been provided by the battery and thus can be used to determine battery life remaining. Since the buck, boost, and buck-boost converter all provide pulses of a fixed size, the number of pulses can be used to determine the charge transferred from the battery. Similarly, in switched-LDO mode, the converter provides a pulse of a fixed size. A traditional, non-switched LDO would not have this ability to maintain Coulomb counting.

Figure 2:
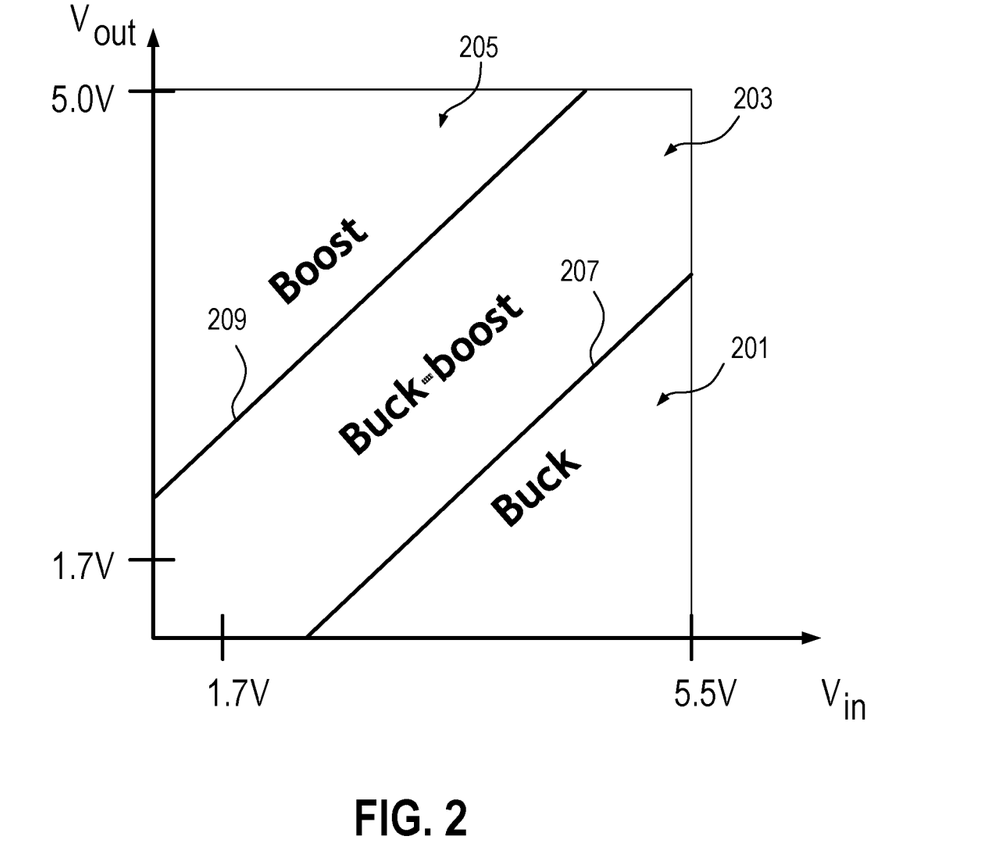
FIG. 2 illustrates an embodiment of transition thresholds used to determine the appropriate mode (buck, buck-boost, or boost) as a function of the input and output voltages.

In an embodiment, if the input voltage can be above or below the output voltage, the full buck-boost converter 103 is used to allow the voltage converter to operate in buck, boost, or buck-boost mode to try and optimize efficiency. While the full buck-boost converter is used, the LDO converter 105 may be powered down completely. When using the full buck-boost converter, the mode controller 107 determines the mode of operation of the buck-boost converter (buck mode, boost mode, or buck-boost mode). FIG. 2 illustrates an example of input and output voltages associated with the various operating modes of the PFM voltage converter. As shown in FIG. 2, when the input voltage is sufficiently above the output voltage in region 201, the PFM voltage converter operates in buck mode. When the output voltage and the input voltage are closer together as shown in region 203, the PFM voltage converter operates in buck-boost mode. When the output voltage is greater than the input voltage as shown in region 205, the PFM voltage converter operates in boost mode. The system is configured to autonomously switch between buck, boost, and buck-boost modes as a function of the output voltage and input voltage. That is, the system switches automatically between modes. FIG. 2 shows an example of the threshold output voltage and input voltages (lines 207 and 209) used to determine the appropriate buck-boost mode of operation for various values of the input voltage and output voltage. Hysteresis may be used to ensure that switching does not occur too frequently when the voltage relationship is close to the transition thresholds shown by lines 207 or 209. The thresholds can be programmed according to the needs of the particular application.

The mode controller 107 incorporates analog and/or digital logic to determine the appropriate mode based on the input and output voltage. For example, the mode controller may utilize an analog comparator 108 and additional analog and/or digital logic 110. The digital logic may utilize state machines, a programmed microcontroller, or any appropriate combination of control logic. The compare operation may use the analog comparator 108 or convert the input and output voltages to digital values and compare digitally. The mode controller 107 determines when to switch to a different mode based on the values of the input voltage and the output voltage and the transition thresholds illustrated, e.g., in FIG. 2. The mode controller 107 supplies the desired mode over signal line 116 to buck-boost controller 104, which in turn controls the transistors M1-M4 appropriate to the desired mode. In addition, the buck-boost controller receives an input from voltage comparator 111 to indicate when the output voltage is below the target voltage, which is used to adjust the pulse frequency to maintain the target output voltage. While not illustrated, other indications (high or low voltage) may also be provided to the buck-boost controller 104. The output of the mode controller 107 selects the setting of switch 115.

Figure 3:
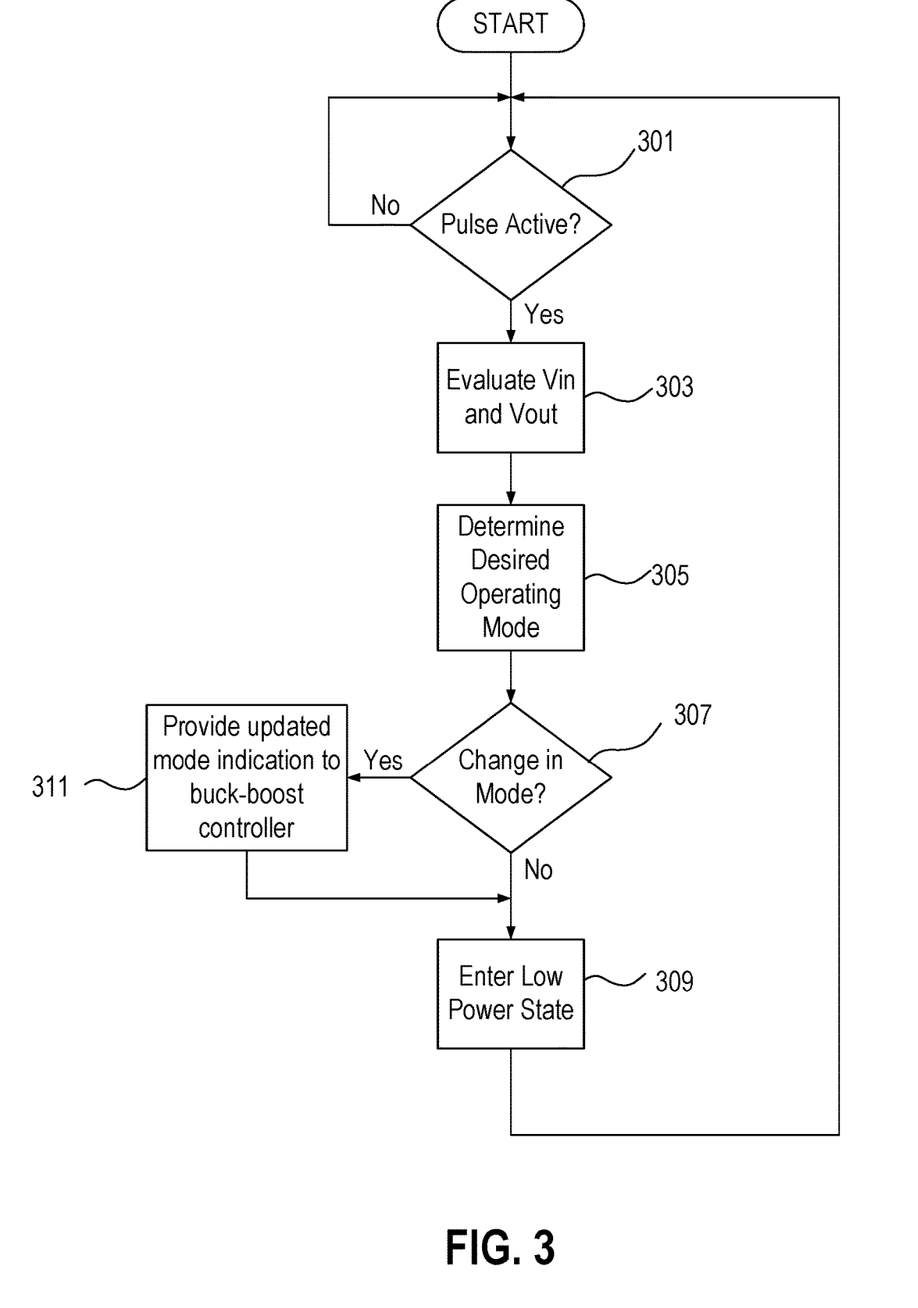
FIG. 3 illustrates a high level flow chart of operation of the mode controller in an embodiment in which the modes of operation can be buck, buck-boost, or boost.

FIG. 3 illustrates a high level flow chart showing operation of the mode controller 107 in an embodiment in which the voltage converter can operate in buck, boost, or buck-boost modes. In 301, the mode controller waits for a pulse active signal 121 (see FIG. 1) from the buck-boost control logic indicating that the pulse supplied by the buck-boost converter is active. In an embodiment, the pulse active signal 121 is asserted for the duration of the pulse. The pulse active signal 121 wakes up a portion of the mode controller from a low power state. The analog portion of the mode controller, such as comparator 108, turns on in response to the pulse active signal 121 being asserted and remains on while the pulse active signal 121 is asserted. That allows for some settling time on the analog circuitry prior to sampling of the comparator output. When the pulse active signal deasserts, the transition is used as a clock for the digital circuitry 110 to latch the voltage difference between the input voltage and the output voltage provided by comparator 108 and determine the appropriate mode of operation.

In a more general sense, the mode comparator could be implemented in other ways. As long as the mode comparator only consumes power during or just after the end of each pulse, then the mode comparator should have negligible impact on system efficiency. In another embodiment, an analog to digital converter (ADC) monitors the input and output voltages and utilizes the start of the pulse signal, the end of pulse signal, or some other signal during the pulse to clock the ADC. The digital voltage values may be used to determine the appropriate mode of operation. The main idea is that if the time between pulses increases (when the output current is very low), the time between mode comparison events should also increase, so that the system does not waste power by constantly running the mode comparator.

In 303 the mode controller evaluates the output voltage and the input voltage to determine the desired operating mode. The evaluation may include comparing the two voltages to determine a voltage difference. As stated above, that may be done using a combination of analog circuits and digital circuits. The voltage difference can then be used to determine a desired operating mode in 305. The selection of the desired operating mode 201, 203, or 205 depicted in FIG. 2 is based on the voltage difference between the input and output voltages, and the threshold voltages shown at 207 and 209. In 307, the mode controller determines if a change in operating mode is needed. That is, the control logic determines if the desired operating mode is the same as the current operating mode. For example, the desired operating mode may be buck mode and the current operating mode is buck mode. If the desired and current operating modes are the same, the mode controller takes no action and returns to the low power state in 309 to await the next pulse active signal in 301. If a mode switch is needed, e.g., from buck mode to buck-boost mode as the battery ages and the voltage supplied by battery declines, the mode controller goes to state 311 and signals the buck-boost controller 104 the new mode over signal line(s) 116. The mode controller then enters the low power state in 309 by, e.g., removing power to a substantial portion of the analog and digital circuitry, and waits for the next pulse active indication in 301. In order to extend battery life, embodiments of the voltage converter described herein try to maintain zero quiescent current to extend battery life. Note that while FIG. 3 describes the mode control functionality as part of the mode controller and separate from the buck-boost controller, other embodiments may combine the control functionality for the buck-boost controller and mode controller.

When the input voltage is guaranteed to always exceed the output voltage, at least until the end of battery life, the system is configured to autonomously switch between buck and LDO modes. In that case, the buck-boost controller 104 may be wired (or otherwise configured) to operate only in buck mode and the voltage converter switches autonomously between buck mode and switched-LDO mode. The mode controller 107 determines when to transition between switched-LDO mode and buck mode. In other embodiments, the LDO converter may not be a switched-LDO converter but a conventional LDO converter. Thus, when operating in LDO mode, the LDO converter may or may not be switched. Of course, utilization of a conventional LDO would prevent continuation of Coulomb counting when switching between buck and LDO mode.

Figure 4:
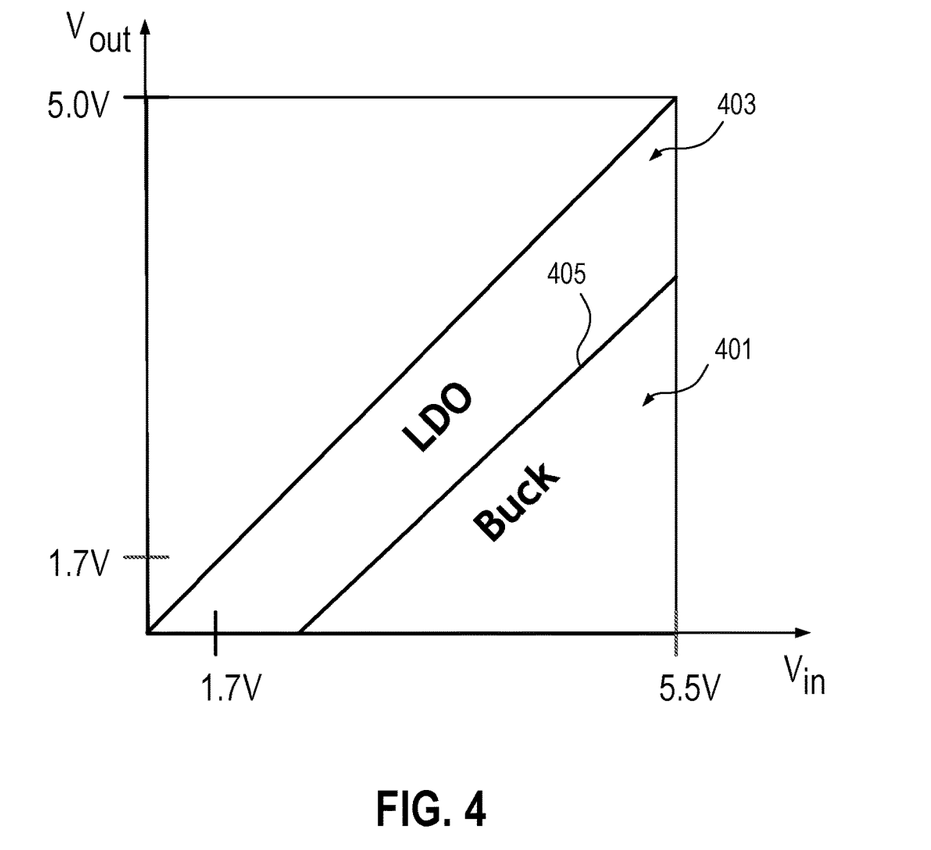
FIG. 4 illustrates an embodiment of transition thresholds used to determine the appropriate mode (buck or switched-LDO) as a function of the input and output voltages.

FIG. 4 illustrates an embodiment of transition thresholds to determine when to operate in buck mode and when to use the LDO mode as a function of the input and output voltages. As shown in FIG. 4, when the input voltage is sufficiently above the output voltage in region 401, the PFM voltage converter 100 operates in buck mode. When the output voltage and the input voltage are closer, as shown in region 403, the voltage converter operates in LDO mode. The system autonomously switches between buck and LDO mode as a function of the output voltage and input voltage. For example, in the example of FIG. 4, line 405 illustrates the transition threshold. Hysteresis may be used to ensure that switching does not occur too frequently when the voltage relationship is close to line 405. The threshold 405 can be programmed according to the needs of the particular application. Note that the mode controller 107 incorporates logic to determine the appropriate mode based on the input and output voltage and conveys that information to buck-boost controller 104 over signal line 116. When in switched-LDO mode, the mode controller 107 controls switch 115 to provide the output of the voltage comparator 111 to the switched-LDO controller 117. The switched-LDO controller 117 controls transistor M5 to cause a fixed pulse responsive to an asserted signal from the voltage comparator 111 indicating the output voltage is below the target output voltage corresponding to reference voltage 119.

Some embodiments include an additional feature which prevents the converter from transitioning from buck mode to LDO mode until the system detects that the buck converter is struggling to provide the required output current. In PFM mode, the pulse typically ends when the voltage converter reaches the programmed peak current. A timer 123 (see FIG. 1) counts to a maximum allowed on-time for the current pulse. In an embodiment, if the buck converter has three consecutive pulses where it reaches the maximum allowed on-time before reaching the programmed peak current, that indicates that the buck converter is struggling to provide the required output current and LDO mode is appropriate. Since the buck converter generally has better efficiency than the LDO converter, it is better to remain in buck mode even after the mode controller transition threshold voltage is reached as long as the buck converter is still capable of supplying the required load. The battery voltage may temporarily dip due to a brief high power operation such as a radio transmission and recover when the operation is completed. Staying in buck mode, if possible, provides a more efficient converter operation as long as possible.

Figure 5:
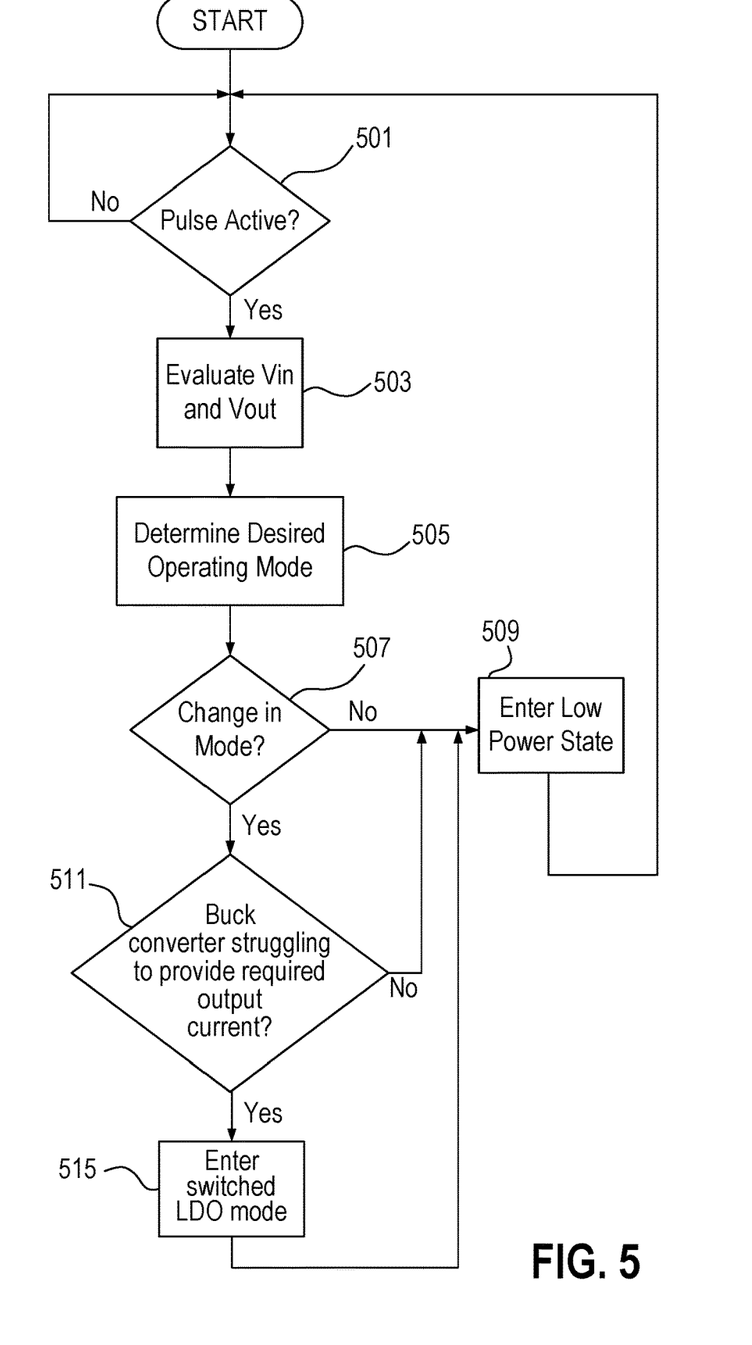
FIG. 5 illustrates a high level flow chart showing operation of the mode controller in an embodiment in which the modes of operation can be buck or switched-LDO.

FIG. 5 illustrates a high level flow chart showing operation of the mode controller 107 when the voltage converter 100 operates only in buck mode or switched-LDO mode. In 501, the mode controller waits for an indication 121 (see FIG. 1) from the buck-boost controller or the switched-LDO controller that the pulse is active. In an embodiment, the comparator 108 compares the input and output voltage during the buck or LDO pulse responsive to the pulse active signal and the logic 110 responds to the deassertion of the pulse active signal to sample the voltage difference. Thus, signal line(s) 121 may include a pulse active indication from both controller 104 and controller 117. The pulse active indication may be used to wake up a portion of the mode controller from a low power state. In 503 the mode controller evaluates the output voltage and the input voltage and provides an indication of the evaluation. The evaluation may include a compare operation using analog circuits, digital circuits, or a combination. The voltage difference between the input and output voltages and the value of the transition threshold voltage at the sampled input and output voltages determines the desired operating mode (401 or 403 in FIG. 4) in 505. The transition threshold voltages are shown at 405 in FIG. 4. In 507, the mode controller determines if a change in operating mode is needed based on whether the desired operating mode is the same as the current operating mode. For example, the desired operating mode may be buck mode and the current operating mode is buck mode. If the desired and current modes are the same, the mode controller needs to take no action and returns to the low power state in 509 and awaits the next pulse active indication in 501. If a mode switch is needed, e.g., from buck mode to switched LDO mode as the battery ages and the voltage supplied by battery declines, the mode controller goes to state 511 and further determines if the buck converter is struggling to provide the required output current. If this pulse is the third, or other appropriate number of pulses, in which the buck converter had reached the maximum allowed on-time before reaching the programmed peak current, thereby indicating that the buck converter is struggling, the mode controller switches the mode to switched LDO-mode in 515 by updating the switch setting of switch 115 and updates the buck converter over signal line 116 that the voltage converter is now operating in LDO-mode. That requires the buck controller 104 to keep track that the three consecutive pulses have occurred with that condition. Signal lines 121 can include a control signal to indicate that the consecutive pulses with that condition have occurred. In some embodiments step 511 is omitted. An additional signal line (not shown in FIG. 1) may be used to notify the switched-LDO controller that the switched-LDO converter is now active. The mode controller then enters the low power state in 509 by, e.g., removing power to a substantial portion of the circuitry, and waits for the next pulse active indication in 301.

Once the converter is in LDO mode, the switched-LDO converter generates pulses of a fixed-width and fixed-current responsive to the output of the voltage comparator 111. The LDO controller turns on M5 as strongly as needed to provide the programmed fixed-current. The output current equals (Vin−Vout)/Resistance_M5. As the input and output voltages get closer together, the resistance of M5 would need to be very low to maintain the desired current. If the input voltage gets very close to the output voltage or falls below the target output voltage, the LDO controller 117 detects this low-battery condition and switches to an LDO-bypass mode. The battery may drop, e.g., due to a sudden increase in demand by the circuits powered by the battery or due to age. The LDO feedback loop detects how strongly M5 is turned on during each pulse. If three consecutive pulses require turning on M5 more strongly than a set threshold for the M5 gate voltage, the LDO converter enters LDO-bypass mode. Of course, other embodiments may use more or fewer consecutive pulses for determining whether to enter LDO-bypass mode. In LDO-bypass mode, the switch (M5) is turned on strongly and left on. The transitions into and out of LDO bypass mode are autonomous and based on the output voltage and the input voltage. The LDO converter exits LDO-bypass mode if the voltage comparator determines that the output voltage recovers to a level above the target voltage.

Thus, various aspects have been described relating to an improved voltage converter that autonomously switches between voltage converter modes. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   determining a desired mode of operation of a pulse frequency modulation (PFM) voltage converter as a function, at least in part, of a voltage difference between an input voltage to the PFM voltage converter and an output voltage generated by the PFM voltage converter;
   generating an indication of the desired mode of operation;
   autonomously switching to the desired mode of operation of the PFM converter responsive to a current mode of operation differing from the desired mode of operation;
   determining the voltage difference only once for each current pulse of the PFM voltage converter; and
   operating circuitry determining the desired mode of operation in a low power state between successive current pulses.

2. The method as recited in claim 1 wherein the current mode of operation is one of a buck mode, a boost mode, and a buck-boost mode and the desired mode of operation is another of the buck mode, the boost mode, and the buck-boost mode.

3. The method as recited in claim 1 further comprising determining the voltage difference responsive to a pulse active signal indicative of the current pulse.

4. A method comprising:
   determining a desired mode of operation of a pulse frequency modulation (PFM) voltage converter as a function, at least in part, of a voltage difference between an input voltage to the PFM voltage converter and an output voltage generated by the PFM voltage converter;
   generating an indication of the desired mode of operation;
   autonomously switching to the desired mode of operation of the PFM converter responsive to a current mode of operation differing from the desired mode of operation;
   wherein the current mode of operation is one of a buck mode and a low drop out (LDO) mode and the desired mode of operation is another of the buck mode and the LDO mode; and
   wherein transitioning from the buck mode to the LDO mode of operation further requires determining that the voltage converter is struggling in the buck mode to provide a required output current.

5. The method as recited in claim 4 further comprising:
   using a switched-LDO converter in the LDO mode; and
   maintaining Coulomb counting for the buck mode and the LDO mode.

6. The method as recited in claim 4 wherein the determining that the voltage converter is struggling to provide the required output current comprises:
   detecting a plurality of consecutive pulses in which a maximum allowed on time is reached before a programmed peak current is reached.

7. A pulse frequency modulation (PFM) voltage converter comprising:
   a mode controller to determine a desired mode of operation of the PFM voltage converter as a function, at least in part, of an input voltage to the PFM voltage converter and an output voltage supplied by the voltage converter;
   wherein the PFM voltage converter is configured to switch to the desired mode of operation responsive to a current mode of operation being different from the desired mode of operation;
   wherein the current mode of operation is one of a buck mode and a low drop out (LDO) mode and the desired mode of operation is another of the buck mode and the LDO mode; and
   wherein the mode controller is configured to transition from the buck mode to the LDO mode of operation responsive to, in part, one or more consecutive pulses in the buck mode in which a maximum allowed on time is reached before a programmed peak current is reached.

8. The PFM voltage converter as recited in claim 7 wherein the mode controller comprises:
   a comparator to compare the output voltage of the PFM voltage converter to the input voltage to the PFM voltage converter and generate an indication of a difference.

9. The PFM voltage converter as recited in claim 7 wherein the input voltage is from a battery.

10. The PFM voltage converter in claim 7 further comprising:
a switched-LDO converter for utilization in the LDO mode.

11. The PFM voltage converter as recited in claim 7 wherein the mode controller determines a desired mode once for each current pulse of the PFM voltage converter.

12. The PFM voltage converter as recited in claim 11 wherein the mode controller evaluates the output voltage and the input voltage responsive to a signal indicative of each current pulse to determine the desired mode.

13. The PFM voltage converter as recited in claim 11 wherein the mode controller enters a low power state between successive current pulses.

14. A pulse frequency modulation (PFM) voltage converter comprising:
a mode controller to evaluate an output voltage of the PFM voltage converter and an input voltage to the PFM voltage converter to select a mode of operation based on one or more transition threshold voltages at the input voltage and the output voltage;
a voltage comparator to compare a reference voltage to the output voltage and supply a voltage comparator output;
a selector circuit coupled to the mode controller to supply the voltage comparator output to a switched-low drop out (LDO) controller of a switched-LDO converter responsive to the mode controller selecting an LDO mode of operation and to supply the voltage comparator output to a buck-boost controller of a buck boost converter responsive to the mode controller selecting a buck mode, a boost mode, or a buck-boost mode of operation; and
wherein the switched-LDO converter generates a current pulse of a fixed width by turning on a transistor in the switched-LDO converter, the transistor coupled between an input voltage node and an output voltage node.

15. The PFM voltage converter as recited in claim 14 wherein the switched-LDO controller turns on the transistor with a strength needed to provide a desired fixed current during the current pulse.

16. The PFM voltage converter as recited in claim 14,
wherein the mode controller selects the mode of operation once for each current pulse provided by the PFM voltage converter; and
wherein the mode controller enters a low power state between successive current pulses.

* * * * *